United States Patent [19]
Chow

[11] Patent Number: 5,698,993
[45] Date of Patent: Dec. 16, 1997

[54] CMOS LEVEL SHIFTING CIRCUIT

[75] Inventor: Hwang-Cherng Chow, Taiwan, China

[73] Assignee: Industrial Technology Research Institute, Hsinchu, Taiwan

[21] Appl. No.: 623,351

[22] Filed: Mar. 28, 1996

[51] Int. Cl.$^6$ .................... H03K 19/0948; H03K 19/017
[52] U.S. Cl. .................... 326/81; 326/17; 326/68; 326/83
[58] Field of Search ................ 326/80–81, 68, 326/83, 112, 119, 121, 115; 327/52, 54–55, 65

[56] References Cited

U.S. PATENT DOCUMENTS

| | | | |
|---|---|---|---|
| 4,486,670 | 12/1984 | Chan et al. | 326/81 |
| 4,695,744 | 9/1987 | Giordano | 327/333 |
| 4,845,381 | 7/1989 | Cuevas | 327/333 |
| 4,996,443 | 2/1991 | Tateno | 326/68 |
| 5,245,228 | 9/1993 | Harter | 326/68 |
| 5,457,420 | 10/1995 | Asada | 326/81 |

Primary Examiner—Edward P. Westin
Assistant Examiner—Jon Santamauro
Attorney, Agent, or Firm—Meltzer, Lippe, Goldstein, Wolf & Schlissel, P.C.

[57] ABSTRACT

A level shifting inverter is provided with first and second drivers which may be level shifting inverters, which each have a low enable input, a high enable input and an output. Each driver outputs a low voltage level or a second high voltage level(that is higher than a first high voltage level of an input signal) depending on enabling and disabling voltage levels received at the high and low enable inputs of each driver. The high enable input of the first and second drivers are connected in a cross-coupled feedback configuration. The input of the first driver receives a complement of the input signal whereas the input of the second driver receives the input signal. The level shifter also has transition driver circuitry. The transition driver circuitry has an input receiving the second high voltage level, a first biasing input receiving the input signal and a second biasing input receiving the complement of the input signal. The transition driver circuitry responds to an input signal voltage level transition by charging the output of a first one of the first and second drivers to approximately the second high voltage level and discharging, to the low voltage level, the output of a second one of the first and second drivers. The charging and discharging of the first and second driver outputs causes a disabling voltage level to be outputted to the high enable input of the first one of the first and second drivers and an enabling voltage level to be outputted to the high enable input of the second one of the first and second drivers.

6 Claims, 6 Drawing Sheets

CMOS LEVEL SHIFTING CIRCUIT

RELATED APPLICATION

The subject matter of this application is related to the subject matter of the following patents and patent applications:

(1) U.S. patent application Ser. No. 08/623,310, entitled, "CMOS Level Shifter with Static and Transient Drivers," filed on even date herewith for Hwang-Cherng Chow.

All of the above-listed patents and patent applications are commonly assigned to the assignee of this application and are incorporated herein by reference.

FIELD OF THE INVENTION

The present invention relates to integrated circuits (ICs), such as, metal oxide semiconductor (MOS) ICs, employing multiple voltage levels to represent a binary value. The present invention is directed to voltage level "interfaces" or level shifters in such circuits.

BACKGROUND OF THE INVENTION

In MOS ICs, MOS devices, such as MOSFETs, are employed which are biased with a high voltage and a low voltage. The low voltage is commonly referred to as $V_{ss}$ and is often 0 volts (ground). The high voltage is commonly referred to as $V_{DD}$ and is often 5 Volts. However, in some low voltage MOS ICs, the high voltage may be less than 5 volts, for example 3 volts. Usually, the low voltage $V_{SS}$ corresponds to a logic '0' value and the higher voltage $V_{DD}$ corresponds to a logic '1' value.

Some MOS ICs must accommodate multiple "high" voltage levels. For sake of convenience, the "larger" high voltage (corresponding to logic value '1') is referred to herein as $V_{DD}$ and the "smaller" high voltage (also corresponding to logic value '1') is referred to as $V_{CC}$. For example, the integrated circuit may have some internal circuitry which uses the $V_{CC}$ voltage level for the logic value '1' and other circuitry which uses the $V_{DD}$ voltage level for the logic value '1'. Alternatively, the internal circuitry uses $V_{CC}$ and converts to-be outputted output signals (i.e., that are outputted to external devices) to $V_{DD}$. FIG. 1 shows a conventional level shifter 10 for converting an input signal that has low $V_{ss}$ and "small" high $V_{cc}$ voltage levels to an output signal with low $V_{ss}$ and "larger" high $V_{DD}$ voltage levels. As shown, the level shifter 10 includes an inverter 20, a first level shifting inverter 30 and a second level shifting inverter 40. The first level shifting inverter 30 is formed from NMOS transistor N1 and PMOS transistor P1. The second level shifting inverter 40 is formed from NMOS transistor N2 and PMOS transistor P2. Each level shifting inverter 30 or 40 has an output node OUT' or OUT which is connected to a common drain connection of the transistors N1 and P1 or the transistors N2 and P2. The gate of the PMOS transistor P1 or P2 in either inverter 30 or 40 is cross-coupled to the output node OUT or OUT' of the other inverter 40 or 30 (the gate of transistor P1 is connected to node OUT and the gate of transistor P2 is connected to node OUT'). The sources of the transistors P1 and P2 are connected to the large high voltage $V_{DD}$ power supply bus and the source of the transistors N1 and N2 are connected to the low voltage $V_{SS}$ power supply bus. The gate of the transistor N1 is connected to the node IN. An inputted signal is applied to the node IN. The inputted signal applied to the node IN is fed to the inverter 20 which outputs the complement of the inputted signal to a node IN'. (Note that the inverter 20 is biased with the small high voltage $V_{CC}$ and the low voltage $V_{SS}$. This is because the voltage levels of the input signal fall in the range of $V_{SS}$–$V_{CC}$). The complement of the input signal applied onto the node IN' is fed to the gate of the transistor N2.

In this configuration, the inverter 30 outputs from the output node OUT' the "level shifted" complement of the input signal and the inverter 40 outputs from the output node OUT the "level shifted" input signal. More particularly, consider the steady-state response of the level shifter 10 wherein the input signal applied to the node IN is a logic '0' with a low voltage level $V_{SS}$. The inverter 20 outputs the complement of the input signal with logic value '1' and voltage level $V_{cc}$ onto the node IN'. The voltage level $V_{CC}$ of the node IN' is applied to the gate of the transistor N2 which is therefore on. The voltage at the drain of the transistor N2 is therefore driven to the voltage level of the biasing voltage received at the source of the transistor N1, namely, $V_{SS}$. The low voltage level $V_{SS}$ of the node IN is applied to the gate of the transistor N1 which is therefore off. The transistor N1 therefore does not drive the node OUT' connected to its drain to any particular voltage.

The drain of the transistor N2 is connected to the output node OUT. Thus, the low voltage level $V_{SS}$, to which the transistor N2 drives the output node OUT, is received at the gate of the transistor P1. As a result, the transistor P1 is on and drives the output node OUT' connected to its drain to the voltage level of the biasing voltage received at its source, namely, $V_{DD}$. The large high voltage level $V_{DD}$, to which the transistor P1 drives the output node OUT', is received at the gate of the transistor P2. As a result, the transistor P2 is off and does not drive its drain, or the output node OUT, to any particular voltage. In short, the logic valued '0' input signal, with low voltage level $V_{SS}$ is level shifted or converted to an output signal outputted from output node OUT with low voltage level $V_{SS}$.

Now consider the steady-state response of the level shifter 10 wherein the input signal applied to node IN is a logic '1', with small high voltage level $V_{CC}$. The inverter 20 outputs the complement of the input signal with logic value '0' and low voltage level $V_{SS}$ onto node IN'. The small high voltage level $V_{CC}$ of the node IN is applied to the gate of the transistor N1 which is therefore on. The transistor N1 therefore drives the node OUT' connected to its drain to the voltage level of the biasing voltage received at the source of the transistor N1, namely, $V_{SS}$. The low voltage level $V_{SS}$ of the node IN' is applied to the gate of the transistor N2 which is therefore off. The transistor N2 therefore does not drive the node OUT connected to its drain to any particular voltage.

The low voltage level $V_{SS}$, to which the transistor N1 drives the output node OUT', is received at the gate of the transistor P2. As a result, the transistor P2 is on and drives the node OUT connected to its drain to the voltage level of the biasing voltage received at its source, namely, $V_{DD}$. The large high voltage level $V_{DD}$, to which the transistor P2 drives the output node OUT, is received at the gate of the transistor P1. As a result, the transistor P1 is off and does not drive the output node OUT' connected to its drain to any particular voltage. In short, the logic valued '1' input signal, with small high voltage level $V_{cc}$ is level shifted or converted to an output signal outputted from output node OUT with large high voltage level $V_{DD}$.

There is a problem with the conventional level shifter circuit 10. Consider the transient response of the level shifter 10, for example, wherein the input signal transitions from the low voltage level $V_{SS}$ (logic '0') to the small high voltage level $V_{CC}$ (logic '1'). Prior to the transition, transistor P1 is on and drives the node OUT' to the large high voltage level $V_{DD}$ and transistor N1 is off. Transistor P2 is off and transistor N2 is on and drives the node OUT to the low voltage level $V_{SS}$. When the input signal transitions its voltage level, the voltage level applied to the node IN transitions from the low voltage level $V_{SS}$ to the small high voltage level $V_{CC}$. The inverter 20 therefore outputs the low voltage level $V_{SS}$ which is applied to node IN'. The low voltage level $V_{SS}$ at the node IN' turns off transistor N2. The small high voltage level $V_{CC}$ at the node IN turns on the transistor N1 which attempts to discharge the node OUT' and lower its voltage level from $V_{DD}$. The problem is that the transistor P1 is still on. In order to turn the transistor P1 off, the transistor P2 has to turn on. This can only happen if the turning on of the transistor N1 can drive the voltage level of the node OUT' sufficiently low to turn on the transistor P2. (Once the transistor P2 turns on, it drives the node OUT to $V_{DD}$. The high voltage $V_{DD}$ of the node OUT is applied to the gate of the transistor P1, thereby turning it off.) Consider now the transient response of the level shifter 10 wherein the input signal transitions from the small high voltage level $V_{CC}$ (logic '1') to the low voltage level $V_{SS}$ (logic '0'). In this latter case, the transistor N2 must drive the output node OUT sufficiently low to turn on the transistor P1.

To ensure that the transistor N1 can drive the node OUT' sufficiently low to turn on the transistor P2 (when a low voltage level $V_{SS}$ to small high voltage level $V_{CC}$ input signal transition occurs), and that the transistor N2 can drive the node OUT sufficiently low to turn on the transistor P1 (when a small high voltage level $V_{CC}$ to low voltage level $V_{SS}$ input signal transition occurs), the so-called "on-impedances" of the PMOS transistors P1 and P2 are made greater than the on-impedances of the NMOS transistors N2 and N1 under the same biasing conditions. The net effect is that when transistor N1 turns on during the $V_{SS}$ to $V_{CC}$ input signal transition, the node OUT' drops significantly below $V_{DD}/2$ and turns on the transistor P2. (Likewise, when the transistor N2 turns on during the $V_{CC}$ to $V_{SS}$ input signal transition, the node OUT drops significantly below $V_{DD}/2$ and turns on the transistor P1.)

However, the greater "on-impedances" of the transistors P1 and P2 have an undesirable effect of slowing the rise-time of the output signals. This is illustrated in FIG. 2 which graphically plots the voltage level of the input signal applied to node IN and the output voltage outputted from the node OUT' with respect to time. As shown, the transition from voltage level $V_{SS}$ (logic value '0') to voltage level $V_{CC}$ (logic value '1') of the input signal at time A results in a reasonably fast "fall" or transition from voltage level $V_{DD}$ to voltage level $V_{SS}$ in the signal outputted from the node OUT'. However, the input signal transition from voltage level $V_{CC}$ (logic value '1') to voltage level $V_{SS}$ (logic value '0') at time B results in a slow "rise" or transition from the voltage level $V_{SS}$ to the voltage $V_{DD}$ in the output signal outputted from the node OUT'. A complementary disparity of a slow rise time (in response to the input signal transition at time A) and fast fall time (in response to the input signal transition at time B) is experienced at the node OUT. As a result, while the level shifter 10 shown in FIG. 1 has some desirable features, such as simplicity, it is slow and has rather asymmetrical rise and fall times.

Other conventional embodiments of the level shifter 10 are known that are formed from inverters 30 and 40 that each have multiple PMOS transistors that are serially connected together in place of the single PMOS transistors P1 or P2.

See U.S. Pat. No. 4,039,862. The gate of one of the PMOS transistors of the serial connection is cross-coupled to the output of the other inverter. The gates of the other PMOS transistors of the serial connection are commonly connected to the gate of the NMOS transistor of the respective inverter. The operation of such level shifting inverters is very similar to the inverters 30 and 40. These other inverters with serial connections of multiple PMOS transistors suffer from the same transition rise time problem.

FIG. 3 shows another conventional level shifter circuit 11, which is disclosed in U.S. Pat. No. 4,695,744. As before, two level shifting inverters 31 and 41 are provided, the level shifting inverter 31 having transistors P1 and N1 and the level shifting inverter 41 having transistors P2 and N2. Furthermore, an inverter 21 is provided which receives an input signal, from a node IN, and outputs the complement of the input signal, to a node IN'. The node IN is connected to the gate of the transistor N1 and the node IN' is connected to the gate of the transistor N2. The node OUT' is connected to the drains of the transistors N1 and P1. The node OUT is connected to the drains of the transistors N2 and P2. The sources of the transistors P1 and P2 are connected to the VDD power supply bus. The sources of the transistors N1 and N2 are connected to the $V_{SS}$ power supply bus. The gate of the transistor P1 is connected to the node OUT and the gate of the transistor P2 is connected to the OUT'.

In addition, an NMOS transistor N3 is connected in a source follower configuration with its gate connected to the node IN', its source connected to the node OUT' and its drain connected to the $V_{CC}$ power supply bus. Likewise, an NMOS transistor N4 is connected in a source follower configuration with its gate connected to the node IN, its source connected to the node OUT and its drain connected to the $V_{CC}$ power supply bus. During steady state operation, the transistors N3 and N4 are off and play no role in the generation of voltage levels at the nodes OUT and OUT'. For instance, when the input signal applied to IN is a low voltage level $V_{SS}$, transistor N4 receives the low voltage $V_{SS}$ at its gate and is off. Transistor N3 receives $V_{CC}$ at its gate. However, the transistor N1 is off and transistor P1 is on. Therefore, the node OUT' is driven by the transistor P1 to the voltage $V_{DD}$. THUS, the voltage $V_{DD}$ of the node OUT' is applied to the source of the transistor N3. Because the source voltage of the transistor N3 is greater than the gate voltage $V_{CC}$ of the transistor N3, the transistor N3 is off. In the case that the input signal applied to the node IN is $V_{CC}$ then the transistor N3 will be off because of the low voltage $V_{SS}$ applied to its gate from node IN'. The transistor N4 will be off because the transistor P2 will drive the node OUT to $V_{DD}$ thereby applying a greater voltage $V_{DD}$ to the source of the transistor N4 than the voltage $V_{CC}$ (from the node IN) applied to its gate. In short, the steady state operation of the level shifter 11 is similar to the steady state operation of the inverter 10 of FIG. 1.

Now consider the transient operation of the inverter 11. Assume that the input signal is initially a low voltage level $V_{SS}$ (logic '0') and then transitions to a small high voltage level $V_{CC}$ (logic '1'). The voltage level on the node IN increases to the small high voltage level $V_{CC}$ and the voltage level on the node IN' decreases to the low voltage level $V_{SS}$. The transistor N3, which receives the low voltage $V_{SS}$ at its gate remains off. As before, the transistor N1 turns on. In addition, the transistor N4 turns on because it receives the small high voltage level $V_{CC}$ at its gate from the node IN. Note that this is possible since the voltage level applied to the source of the transistor N4 via the node OUT is initially at a low voltage near $V_{SS}$ and rises more slowly than the voltage level of the node IN. Since the transistor N4 is on, the transistor charges the node OUT and drives it to the voltage level $V_{CC}-V_T$ where $V_T$ is the threshold voltage of the transistor N4. When the node OUT reaches the voltage level $V_{CC}-V_T$, the source voltage of the transistor N4 becomes too high for the transistor N4 to remain on. As such, the transistor N4 turns off. However, by virtue of the transistor N4 being on initially when the transition occurs, the transistor N4 charges up the node OUT more quickly than during the corresponding input signal voltage level transition at level shifter 10 of FIG. 1. As such, the transistor P1 turns off at an earlier time so that the transistor N1 can discharge the node OUT' (and drive it to $V_{SS}$) more completely and at an earlier time. This in turn causes the transistor P2 to turn on more completely and at an earlier time so as to drive the node OUT up to the large high voltage level $V_{DD}$ at an earlier time.

The converse transition time is decreased by the transistor N3. Assume that the input signal voltage level is initially $V_{CC}$ and then transitions to $V_{SS}$ (causing the voltage level at node IN to transition to $V_{SS}$ and the voltage at node IN' to transition to $V_{CC}$). Thus, transistor N1 turns off, transistor N4 remains off, and transistors N2 and N3 turn on. Again, transistor N3 turns on because it receives the small high voltage level $V_{CC}$ at its gate and because the voltage level applied to its drain from the node OUT' rises more slowly from its low level of $V_{SS}$ than the voltage level at the node IN'. Transistor N3 therefore charges the node OUT' thereby increasing its voltage level to $V_{CC}-V_T$. When the node OUT' reaches the voltage level $V_{CC}-V_T$, the transistor N3 turns off. However, the voltage level at the node OUT' rises much more quickly than during the corresponding $V_{CC}$ to $V_{SS}$ input signal transition at the level shifter 10 shown in FIG. 1. This causes the transistor P2 to turn off at an earlier time thereby enabling the transistor N2 to discharge the node OUT (and drive it to $V_{SS}$) more completely and at an earlier time. As a result, the transistor P1 turns on more completely and at an earlier time so as to drive the node OUT' to the large high voltage $V_{DD}$ at an earlier time.

The level shifter 11 therefore reduces switching time and decreases the asymmetry between the fall and rise times of the nodes OUT and OUT'. This is achieved with "transition" driver transistors N3 and N4 which charge up the node OUT or OUT' to speed up the switching of the transistors P1 and P2 during a voltage level transition of the input signal. Note that only one of the transition drivers N3 or N4 operates during each transition; the other transistor is idle. Thus, the transition drivers N3 and N4 are not used to their fullest potential.

It is an object of the present invention to overcome the disadvantages of the prior art. It is a particular object of the present invention to decrease the switching time of a level shifter during a transition yet conserve components.

SUMMARY OF THE INVENTION

These and other objects are achieved according to the present invention. According to one embodiment, the level shifter includes first and second drivers. Each of the drivers has a low enable input, a high enable input and an output. The driver outputs from its respective driver output a low voltage level signal when an enabling voltage level is received at its low enable input and a disabling voltage is received at its high enable input. The driver outputs at its respective driver output a first high voltage level signal, (that is higher than a second high voltage level of the input signal) when a disabling voltage level is received at its low enable input and an enabling high voltage level is received at its high enabling input. The high enable input of the first driver is connected to the output of the second driver. The high enable input of the second driver is connected to the output of the first driver. The input of the first driver receives a complement of the input signal. The input of the second driver receives the input signal. The level shifter also has transition driver circuitry. The transition driver circuitry has an input receiving the second high voltage level, a first biasing input receiving the input signal and a second biasing input receiving the complement of the input signal. The transition driver circuitry responds to a input signal voltage level transition by charging the output of a first one of the first and second drivers to approximately the second high voltage level and discharging, to the low voltage level, the output of a second one of the first and second drivers. The charging and discharging of the first and second driver outputs causes a disabling voltage level to be outputted to the high enable input of the first one of the first and second drivers and an enabling voltage level to be outputted to the high enable input of the second one of the first and second drivers.

The charging of one driver output, while simultaneously discharging the other driver output, reduces the time required to generate the enabling and disabling voltage levels, that are appropriate for the new logic value to which the input signal transitions. The reduction in time in generating the appropriate enabling and disabling signals, in turn, reduces the time for transitioning the outputs of the first and second drivers to the voltage levels corresponding to the new voltage level/logic value to which the input signal transitions. Since the time required for generating both the enabling and disabling signals are simultaneously decreased, the transition time is markedly reduced.

DETAILED DESCRIPTION OF THE INVENTION

Figure 4:
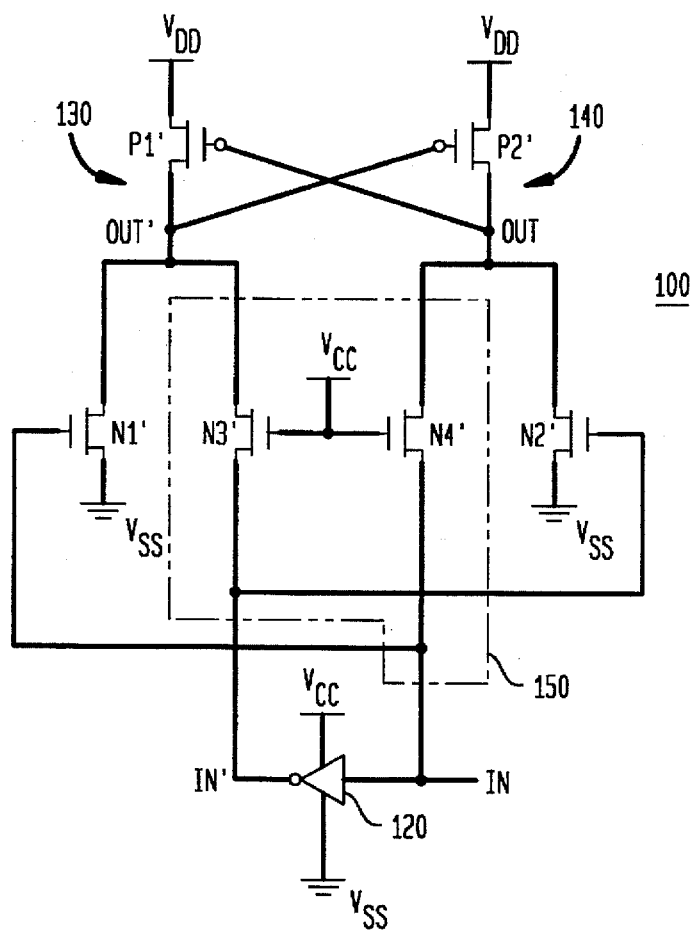
FIG. 4 shows a level shifter according to a first embodiment of the present invention.

FIG. 4 shows a level shifter 100 according to an embodiment of the present invention. The level shifter 100 includes an inverter 120, two drivers 130 and 140, in the form of level shifting inverters, and transition driver circuitry 150. The level shifting inverter 130 includes NMOS transistor N1' and PMOS transistor P1' which are commonly connected at their drains. This common drain connection also serves as the output node OUT'' of the inverter 130. The source of the transistor P1' is connected to the large high voltage $V_{DD}$ power supply bus and the source of the transistor N1' is connected to the low voltage $V_{SS}$ power supply bus. The gate of the transistor P1' serves as the high enable input of the inverter 130 and the gate of the transistor N1' serves as the low enable input of the inverter 13D. The level shifting inverter 140 includes the NMOS transistor N2' and PMOS transistor P2' which are commonly connected at their drains. This common drain connection also serves as the output node OUT' of the inverter 140. The source of the transistor P2' is connected to the large high voltage $V_{DD}$ power supply bus and the source of the transistor N2' is connected to the low voltage $V_{SS}$ power supply bus. The gate of the transistor P2' serves as the high enable input of the inverter 140 and the gate of the transistor N2' serves as the low enable input of the inverter 140.

Figure 1:
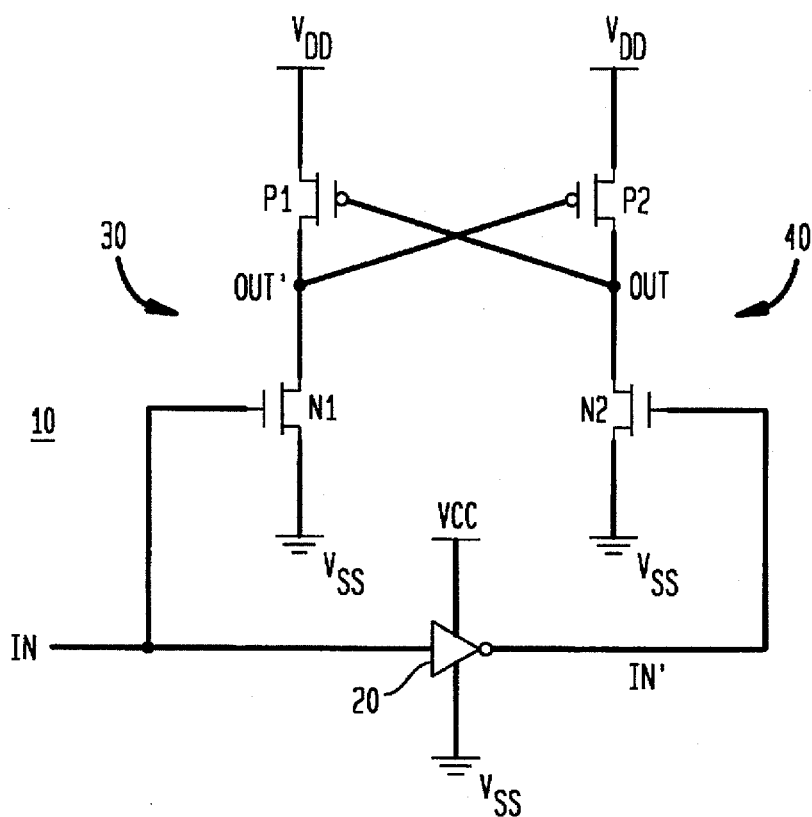
FIG. 1 shows a first conventional level shifter.
Figure 2:
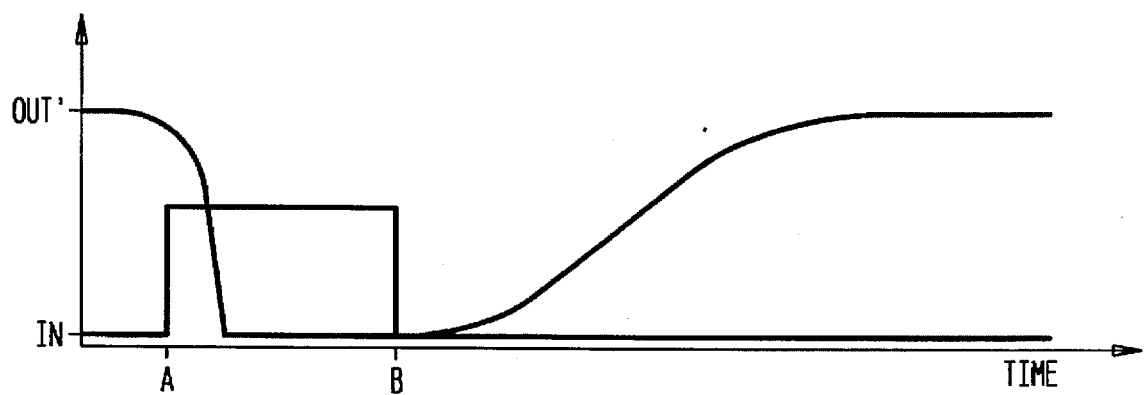
FIG. 2 plots the transition rise and fall times of the voltage level outputted from the conventional level shifter of FIG. 1.
Figure 3:
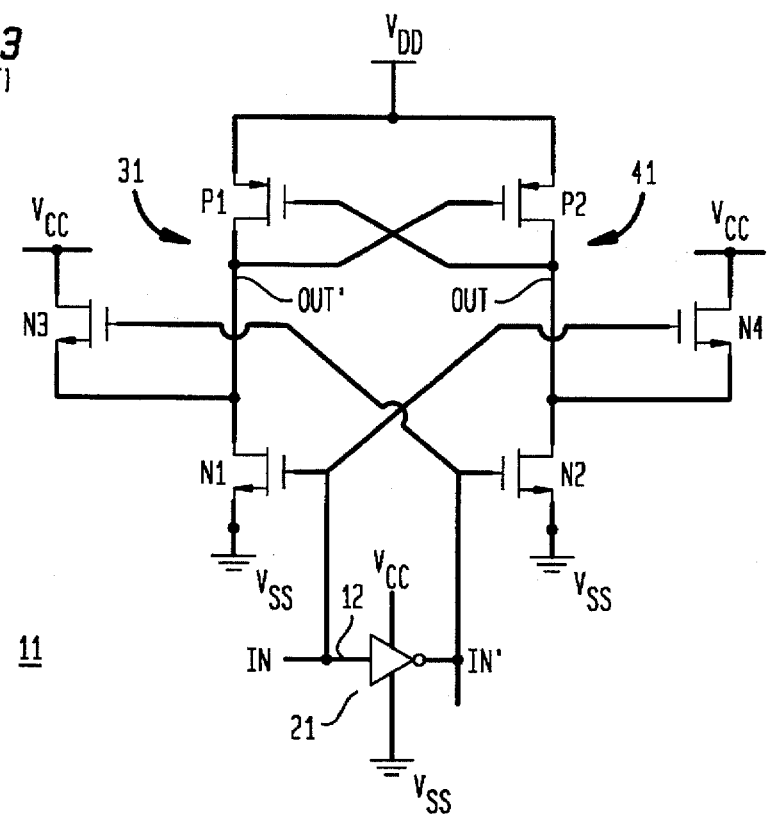
FIG. 3 shows a second conventional level shifter.

As in FIGS. 1 and 3, the high enable input of the inverter 130 is connected to the output node OUT' of the inverter 140 and the high enable input of the inverter 140 is connected to the output node OUT' of the inverter 130. The low enable input of the inverter 130 receives the input signal from a node IN. The input signal is inputted to the inverter 120 which outputs the complement of the input signal onto the node IN'. The complement of the input signal is received at the low enable input of the inverter 140 from the node IN'.

The transition driver circuitry 150 includes two additional transistors N3' and N4'. Both transistors N3' and N4' receive the small high voltage $V_{CC}$ at their gates. The transistor N3' receives a biasing voltage from the node IN' at its source. The drain of the transistor N3' is connected to the node OUT'. The transistor N4' receives a biasing voltage from the node IN at its source. The drain of the transistor N4' is connected to the node OUT. The drains of the transistors N3' and N4' serve as the outputs of the transition driver circuitry 150.

In the transition driver circuitry 150, both transistors N3' and N4' continuously receive the small high voltage level $V_{CC}$ at their gates. As a result, both the transistors N3' and N4' act as "pass transistors." That is, so long as the drain-source voltage of the transistor N3' or N4' is less than the voltage level applied to the gate of the transistor N3' or N4', namely, $V_{CC}$, less the threshold voltage $V_T$ of the transistor N3' or N4', the transistor N3' or N4' is on and drives its drain to the voltage of its source. As soon as the drain voltage exceeds $V_{CC}-V_T$ the transistor N3' and N4' cuts off. As described below, this assists in speeding up the transient response, or response during a transition in voltage level of the input signal, of the level shifter 100.

Consider first the steady-state operation of the level shifter 100 where the input signal is the low voltage level $V_{SS}$ (logic '0'). The node IN is at the low voltage level $V_{SS}$ and the node IN' is the small high voltage level $V_{CC}$. The low voltage level $V_{SS}$ of the node IN is received at the gate of the transistor N1' which is off and does not drive the output node OUT'. On the other hand, the small high voltage level $V_{CC}$ is received at the gate of the transistor N2' which is on and drives the output node OUT to the low voltage level $V_{SS}$. The low voltage level $V_{SS}$ of the node OUT is received at the gate of the transistor P1' which is on. The transistor P1' drives the node OUT' to the large voltage level $V_{DD}$. The large voltage level $V_{DD}$ of the node OUT' is received at the gate of the transistor P2' which is off and therefore does not drive the output node OUT. The low voltage level $V_{SS}$ of the node IN is received at the source of the transistor N4'. The low voltage of the node OUT is received at the drain of the transistor N4'. The small high voltage $V_{CC}$ is received at the gate of the transistor N4'. Thus, the transistor N4' is on and assists the transistor N2 in driving the output node OUT to ground. The small high voltage $V_{CC}$ of the node IN is received at the source of the transistor V3'. The large high voltage $V_{DD}$ of the node OUT' is received at the drain of the transistor V3'. The gate of the transistor N3' receives the small high voltage $V_{CC}$. Since the drain is at a higher voltage than the source and the gate of the transistor N3', the transistor N3' is off and does not drive the output node OUT'.

Consider now the steady-state operation of the level shifter 100 where the input signal is the small high voltage level $V_{CC}$ (logic '1'). The node IN is at the small high voltage level $V_{CC}$ and the node IN' is the low voltage level $V_{SS}$. The low voltage level $V_{SS}$ of the node IN' is received at the gate of the transistor N2' which is off and does not drive the output node OUT. On the other hand, the small high voltage level $V_{CC}$ is received at the gate of the transistor N1' which is on and drives the output node OUT' to the low voltage level $V_{SS}$. The low voltage level $V_{SS}$ of the node OUT' is received at the gate of the transistor P2' which is on. The transistor P2' drives the node OUT to the large high voltage level $V_{DD}$. The large high voltage level $V_{DD}$ of the node OUT is received at the gate of the transistor P1' which is off and therefore does not drive the output node OUT'. The low voltage level $V_{SS}$ of the node IN' is received at the source of the transistor N3'. The low voltage $V_{SS}$ of the node OUT' is received at the drain of the transistor N3'. The small high voltage $V_{CC}$ is received at the gate of the transistor N3'. Thus, the transistor N3' is on and assists the transistor N1' in driving the output node OUT' to ground. The small high voltage $V_{CC}$ of the node IN is received at the source of the transistor N4'. The large high voltage $V_{DD}$ of the node OUT is received at the drain of the transistor N4'. The gate of the transistor N4' receives the small high voltage $V_{CC}$. Since the drain is at a higher voltage than the source and the gate of the transistor N4', the transistor N4' is off and does not drive the output node OUT.

Consider now the transient response of the level shifter 100 during an input signal transition from the low voltage level $V_{SS}$ (logic '0') to the small high voltage level $V_{CC}$ (logic '1'). This causes the node IN to transition to the small high voltage level $V_{CC}$ and the node IN' to transition to the low voltage level $V_{SS}$. As such, the transistor N2' turns off and does not drive the node OUT. Furthermore, the transistor N1' turns on and begins to discharge the node OUT', and drive down the voltage level of the node OUT' from the large high voltage level $V_{DD}$. Consider that the source voltage of the transistor N3' (received from the node IN') now switches to the low voltage $V_{SS}$. As such, the transistor N3' turns on and assists the transistor N1' in discharging the node OUT and driving its voltage level down to $V_{SS}$. Simultaneously, while the transistors N1' and N3' turn on and discharge the node OUT', the transistor N4' receives the low voltage near $V_{SS}$ at its drain and the small high voltage $V_{CC}$ at its source. As such, the transistor N4' remains on and begins to charge up the node OUT and drive it to the small high voltage level less the threshold voltage of the transistor N4' $V_{CC}-V_T$. This speeds up the turn off of the transistor P1' which receives the voltage level of the node OUT at its gate. As such, the transistors N3' and N1' can more completely and more quickly discharge the node OUT' and drive it to $V_{SS}$. When the voltage level of the node OUT' reaches the turn on threshold of the transistor P2', the transistor P2' turns on and drives the node OUT to the large high voltage level $V_{DD}$. Invariably, this causes the voltage level of the node OUT to exceed $V_{CC}-V_T$ thereby causing the transistor N4' to turn off. The large high voltage $V_{DD}$ of the node OUT also fully turns off the transistor P1' (turns it off more completely).

Also consider the transient response of the level shifter 100 during an input signal transition from the small high voltage level $V_{CC}$ (logic '1') to the low voltage level $V_{SS}$ (logic '0'). This causes the node IN to transition to the low voltage level $V_{SS}$ and the node IN' to transition to the small high voltage level $V_{CC}$. As such, the transistor N1' turns off and does not drive the node OUT'. Furthermore, the transistor N2' turns on and begins to discharge of the node OUT from the own the voltage level of the node OUT from the large high voltage level $V_{DD}$. Consider that the source voltage of the transistor N4' (received from the node IN) now switches to the low voltage $V_{SS}$. As such, the transistor N4' turns on and assists the transistor N2' in discharging the node OUT and driving its voltage level down to $V_{SS}$. Simultaneously, while the transistors N2' and N4' turn on and discharge the node OUT, the transistor N3' receives the low voltage near $V_{SS}$ at its drain and the small high voltage $V_{CC}$ at its source. As such, the transistor N3' remains on and begins to charge up the node OUT' and drive it to the small high voltage level less the threshold voltage of the transistor N3' $V_{CC}$–$V_T$. This speeds up the turn off of the transistor P2' which receives the voltage level of the node OUT' at its gate. As such, the transistors N4' and N2' can more completely and more quickly discharge the node OUT and drive it to $V_{SS}$. When the voltage level of the node OUT reaches the turn on threshold of the transistor P1', the transistor P1' turns on and drives the node OUT' to the large high voltage level $V_{DD}$. Invariably, this causes the voltage level of the node OUT' to exceed $V_{CC}$–$V_T$ thereby causing the transistor N3' to turn off. The large high voltage $V_{DD}$ of the node OUT' also fully turns off the transistor P2' (turns it off more completely).

Figure 5:
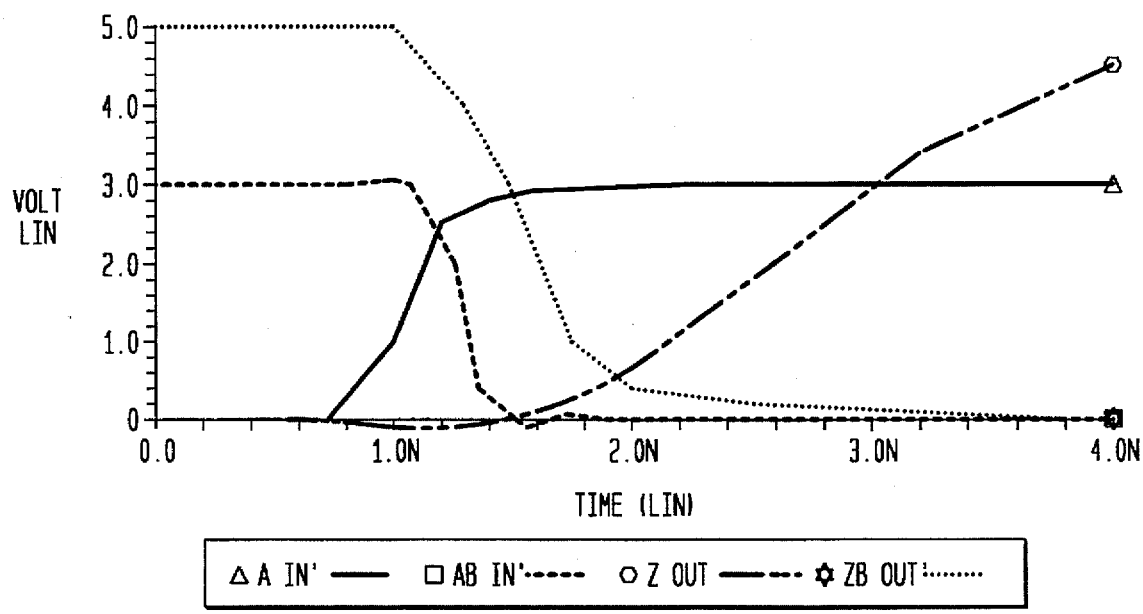
FIGS. 5-6 plot the rise and fall times of the conventional level shifter of FIG. 1.
Figure 6:
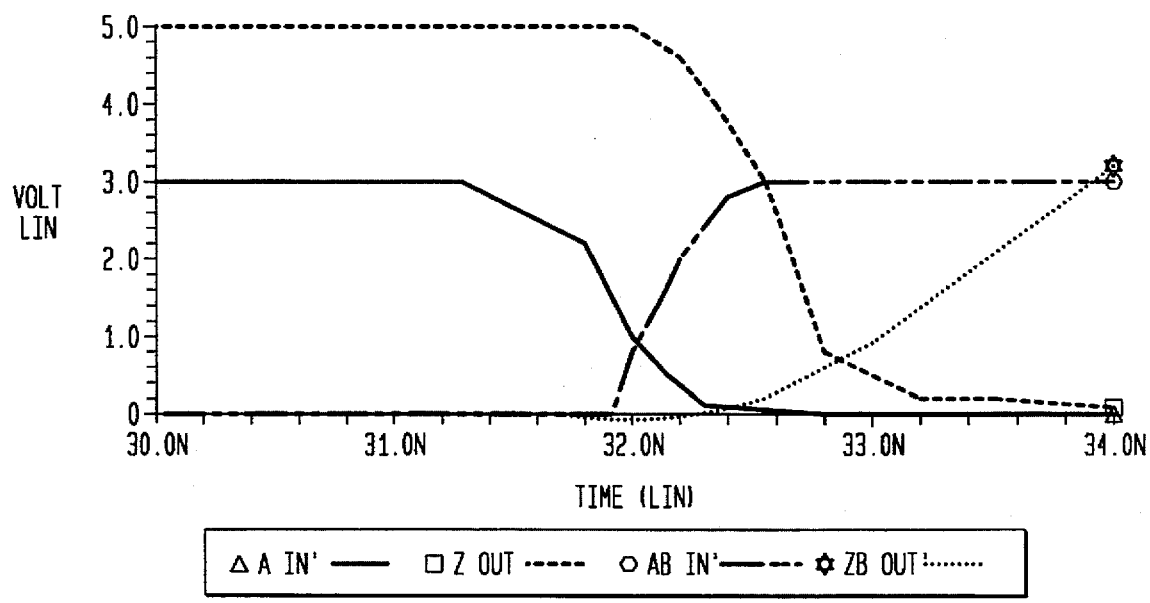
Figure 7:
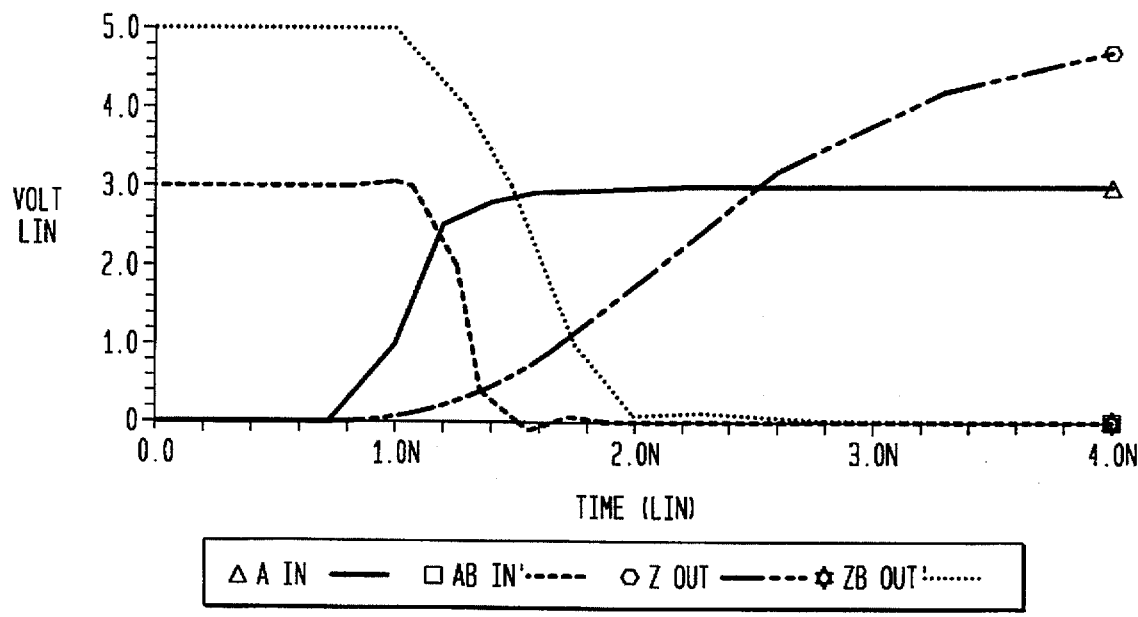
FIGS. 7-8 plot the rise and fall times of the conventional level shifter of FIG. 3.
Figure 8:
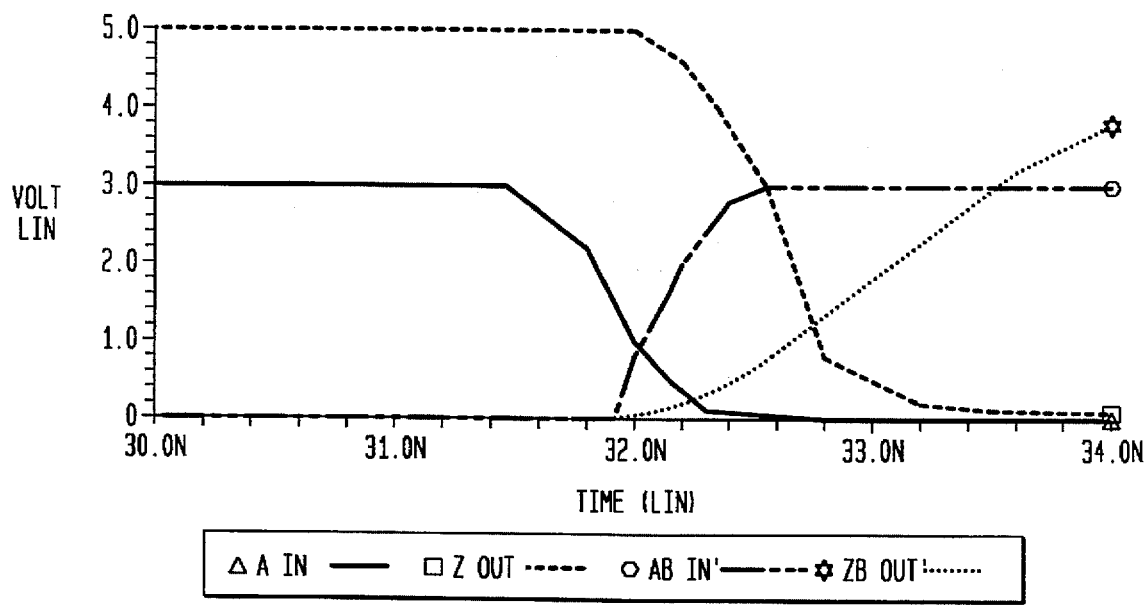
Figure 9:
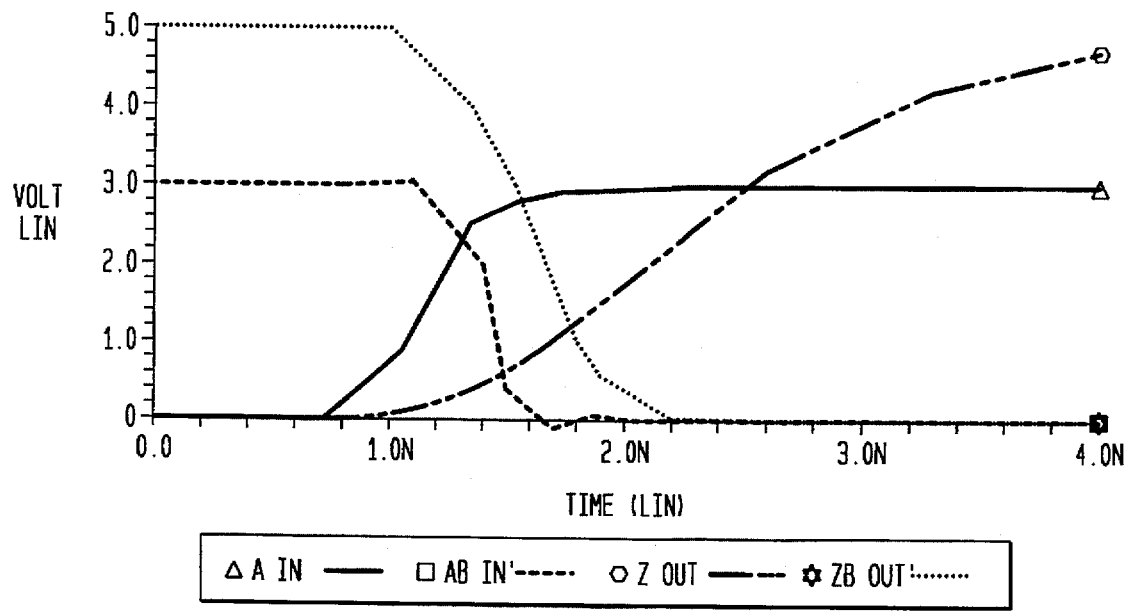
FIGS. 9-10 plot the rise and fall times of the level shifter of FIG. 4.
Figure 10:
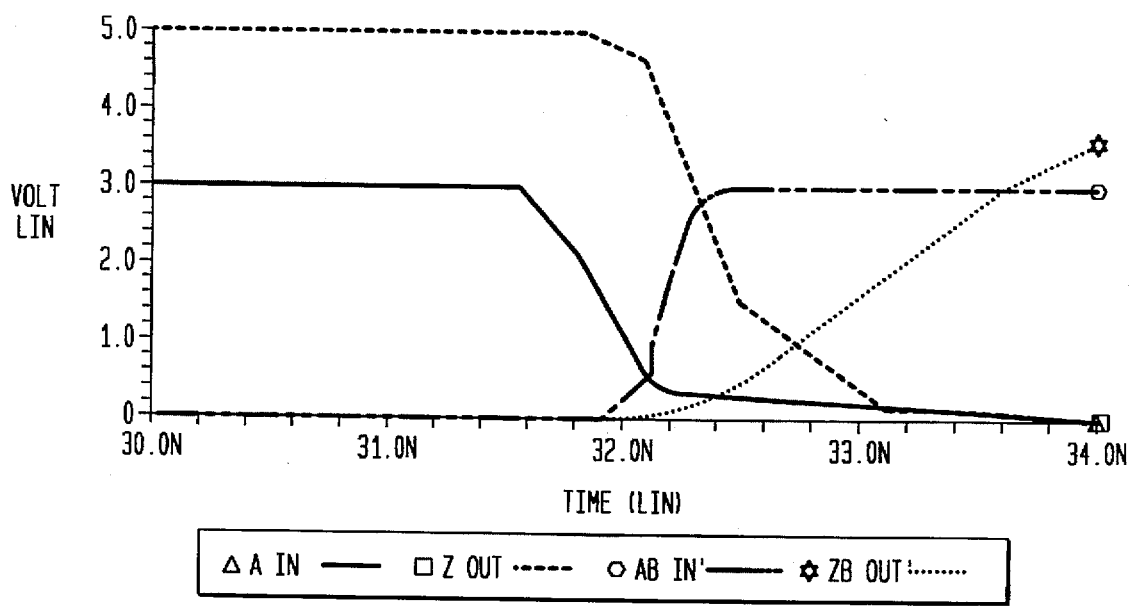

Note that the transistors N3' and N4' operate simultaneously during a transition in voltage level of the input signal. One of the transistors (i.e., the transistor N3', during the $V_{CC}$ to $V_{SS}$ input signal voltage level transition, and the transistor N4', during the $V_{SS}$ to $V_{CC}$ input signal voltage level transition) charges up the output node to which it is connected. Meanwhile, the other transistor (i.e., the transistor N4', during the $V_{CC}$ to $V_{SS}$ input signal voltage level transition, and the transistor N3', during the $V_{SS}$ to $V_{CC}$ input signal voltage level transition) discharges the output node to which it is connected. The simultaneous charging and discharging of the output nodes of the level shifter 100 speeds up the switching of the PMOS transistors P1' and P2' thereby causing the transient response time of the level shifter 100 to decrease. This is illustrated in FIGS. 5–10 which plot the simulated transient response of the level shifters 10 (FIG. 1), 11 (FIG. 3) and 100 (FIG. 4). In the simulations, a 0.1 pF load is presumed to be driven by OUT and OUT'. FIG. 5 plots the "low-to-high" transient response of the conventional level shifter 10 of FIG. 1 and FIG. 6 plots the "high-to-low" transient response of the conventional level shifter 10 of FIG. 1. Compare the high-to-low propagation delays $t_{phl}$ and the low-to-high propagation delays $t_{plh}$. The high-to-low propagation delay $t_{phl}$ is defined as the time period between the time at which the voltage level of the node IN (or IN') falls to $V_{CC}/2$ and the voltage level of the corresponding node OUT (or OUT') falls to VDD/2. Likewise, the low-to-high propagation delay $t_{plh}$ is defined as the time period between the time at which the voltage level of the node IN (or IN') rises to $V_{CC}/2$ and the time at which the voltage level of the corresponding node OUT (or OUT') rises to $V_{DD}/2$. As shown, the low-to-high propagation delay is $t_{plh}$=1.6084 nsec whereas the high-to-low propagation delay is $t_{phl}$=0.60329 nsec. FIG. 7 plots the low-to-high transient response of the conventional level shifter 11 of FIG. 3 and FIG. 8 plots the high-to-low transient response of the conventional level shifter 11 of FIG. 3. As shown, the low-to-high propagation delay is $t_{plh}$=1.2825 nsec whereas the high-to-low propagation delay is $t_{phl}$=0.58532 nsec. FIG. 9 plots the low-to-high transient response of the inventive level shifter 100 of FIG. 4 and FIG. 9 plots the high-to-low transient response of the inventive level shifter 100 of FIG. 4. As shown, the low-to-high propagation delay is $t_{plh}$=1.2296 nsec whereas the high-to-low propagation delay is $t_{phl}$=0.52532 nsec. Thus, the smallest low-to-high propagation delay time (and high-to-low propagation delay time) is achieved by the level shifter 100 of the present invention.

Figure 11:
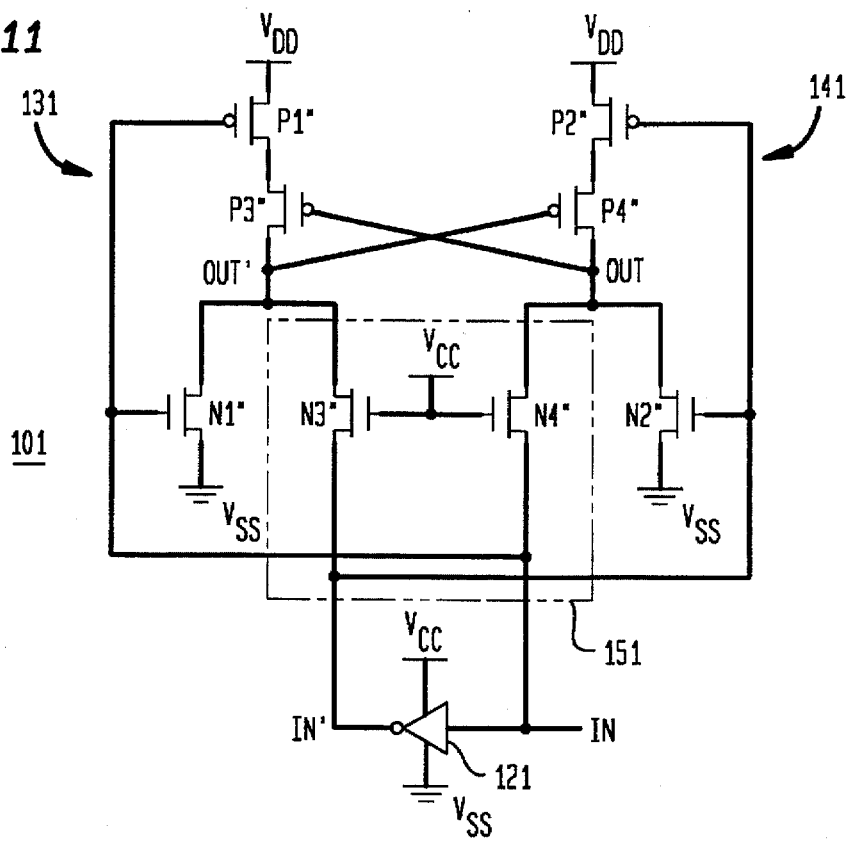
FIG. 11 shows a level shifter according to a second embodiment of the present invention.

FIG. 11 shows a level shifter 101 according to a second embodiment of the present invention. As before, the level shifter 101 includes two drivers 131 and 141, and inverter 121 and transition driver circuitry 151. The inverter 121 and transition driver circuitry 151 are identical to the inverter 120 and transition driver circuitry 150 of FIG. 4 and operate in a similar fashion. The drivers 131 and 141 are in the form of level shifting inverters. Unlike the inverters 130 and 140 of FIG. 4, the inverters 131 and 141 are formed with a serial connection of multiple PMOS transistors.

For instance, the inverter 131 includes PMOS transistor P1" having its source connected to the VDD power supply bus and its gate connected to the node IN. The inverter 131 has a second PMOS transistor P3" which has a source connected to the drain of the transistor P1" and its drain connected to the node OUT'. The gate of the transistor P3" is connected to the output node OUT of the other driver 140. This gate connection serves as the high enable input. As before, the inverter 131 includes an NMOS transistor N1" having a drain connected to the node OUT', a source connected to the $V_{SS}$ power supply bus and its gate connected to the node IN.

Like the inverter 131, the inverter 141 includes PMOS transistor P2" having its source connected to the $V_{DD}$ power supply bus and its gate connected to the node IN. The inverter 131 has a second PMOS transistor P4" which has a source connected to the drain of the transistor P2" and its drain connected to the node OUT. The gate of the transistor P4" is connected to the output node OUT' of the other driver 131. This gate connection serves as the high enable input of the driver 141. As before, the inverter 141 includes an NMOS transistor N2" having a drain connected to the node OUT, a source connected to the $V_{SS}$ power supply bus and its gate connected to the node IN'.

The transistors P1" and P2" function as "pass" transistors. Generally speaking, both transistors P1" and P2" are always on when the input signal is $V_{SS}$ or $V_{CC}$. Otherwise, the operation of the level shifter 101 is very similar to the level shifter 100. In particular, the transistors N3" and N4" of the transition driver circuitry selectively charge one node OUT or OUT' while discharging the other node OUT' or OUT so as to increase the switching speed of the level shifter 101 during a transition in input signal voltage level.

Figure 12:
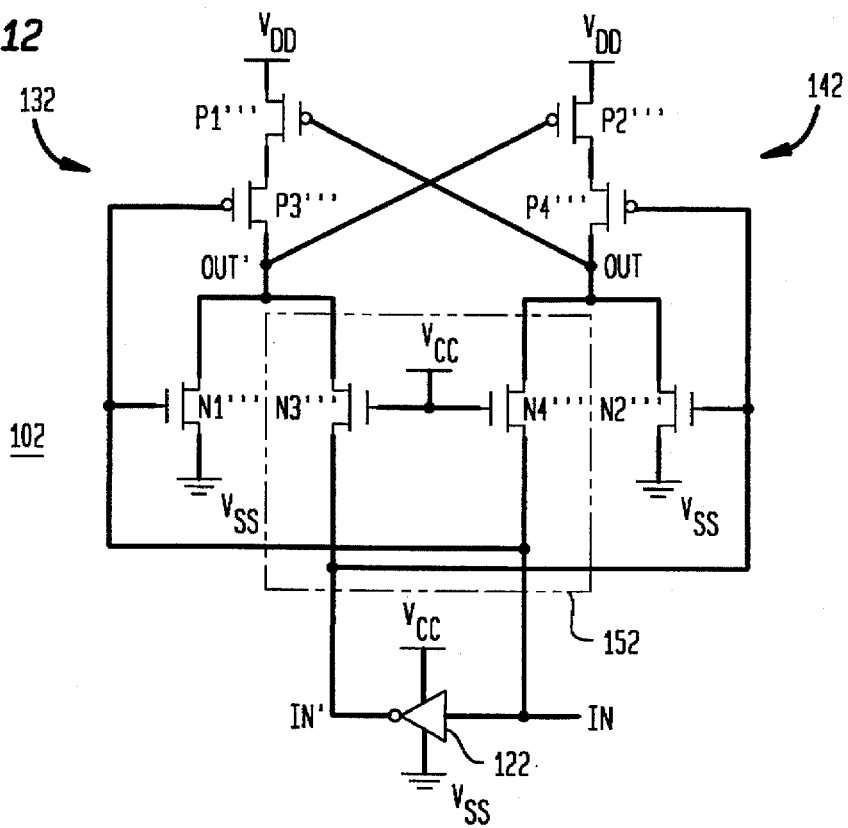
FIG. 12 shows a level shifter according to a third embodiment of the present invention.

FIG. 12 shows a level shifter 102 according to a third embodiment of the present invention. The level shifter 102 has an inverter 122, a level shifting inverter/driver 132 with transistors P1''', P3''' and N1''', a level shifting inverter/driver 142 with transistors P2''', P4''' and N2''', and transition driver circuitry 152 with transistors N3''' and N4'''. The level shifter 102 is very similar to the level shifting inverter 101 of FIG. 11 except that the gate connections (roles) of the transistors P1''' and P3''' and the transistors P2''' and P4''' are reversed in respect to the transistors P1" and P3" and the transistors P2" and P4" in FIG. 11. The operation of the level shifter 102 is otherwise very similar to the operation of the level shifter 101 and 100 and is therefore not repeated.

In short, a level shifting inverter is provided with first and second drivers. Each of the drivers has a low enable input, a high enable input and an output. The driver outputs from its respective driver output a low voltage level signal when an enabling voltage level is received at its low enable input and a disabling voltage is received at its high enable input. The driver outputs at its respective driver output a first high voltage level signal, (that is higher than a second high voltage level of the input signal) when a disabling voltage level is received at its low enable input and an enabling high voltage level is received at its high enabling input. The high enable input of the first driver is connected to the output of the second driver. The high enable input of the second driver is connected to the output of the first driver. The input of the first driver receives a complement of the input signal. The input of the second driver receives the input signal. The level shifter also has transition driver circuitry. The transition driver circuitry has an input receiving the second high voltage level, a first biasing input receiving the input signal and a second biasing input receiving the complement of the input signal. The transition driver circuitry responds to an input signal voltage level transition by charging the output of a first one of the first and second drivers to approximately the second high voltage level and discharging, to the low voltage level, the output of a second one of the first and second drivers. The charging and discharging of the first and second driver outputs causes a disabling voltage level to be outputted to the high enable input of the first one of the first and second drivers and an enabling voltage level to be outputted to the high enable input of the second one of the first and second drivers.

Finally, the above-discussion is intended to be merely illustrative of the invention. Numerous alternative embodiments may be devised by those having ordinary skill in the art without departing from the spirit and scope of the following claims.

The claimed invention is:

1. A level shifter comprising:

first and second drivers, each comprising a low enable input, a high enable input and an output which outputs a low voltage level signal when an enabling voltage level is received at said low enable input and a disabling voltage is received at said high enable input, and which outputs a first high voltage level signal, that is higher than a second high voltage level of an input signal, when a disabling voltage level is received at said low enable input and an enabling high voltage level is received at said high enable input, said high enable input of said first driver being connected to said output of said second driver, said high enable input of said second driver being connected to said output of said first driver, said low enable input of said first driver receiving a complement of said input signal and said low enable input of said second driver receiving said input signal, and transition driver circuitry, having an input receiving said second high voltage level, a first biasing input receiving said input signal and a second biasing input receiving said complement of said input signal, said transition driver circuitry responding to a input signal voltage level transition by charging said output of a first one of said first and second drivers to approximately said second high voltage level, and selectively discharging, to said low voltage level, said output of a second one of said first and second drivers so as to output a disabling voltage level to said high enable input of said first one of said first and second drivers and to output an enable voltage level to said high enable input of said second one of said first and second drivers.

2. The level shifter of claim 1 wherein each of said first and second drivers comprises:

an NMOS transistor, having its gate connected to said corresponding low enable input, a source receiving said low level voltage and a drain connected to said respective output, and a serial connection of at least one PMOS transistor, said serial connection having at least one gate connected to said corresponding high enable input, a source receiving said first high voltage level and a drain connected to said corresponding output.

3. The level shifter of claim 1 wherein said transition driver circuitry comprises:

a first NMOS transistor having a gate connected to said input, a source connected to said first biasing input and a drain connected to said first driver output, and a second NMOS transistor having a gate connected to said input, a source connected to said second biasing input and a drain connected to said second driver output.

4. The level shifter of claim 1 wherein in response to said input signal transitioning from a low voltage level to said second high voltage level:

said transition driver circuitry charges said first driver output, until said first driver output reaches said second high voltage level and thereafter ceases to charge said first driver output, and said transition driver circuitry simultaneously discharges said second driver output down to said low voltage level as soon as said second biasing input receives a voltage that is a threshold voltage less than said second voltage.

5. The level shifter of claim 4 wherein said first driver begins to output, from said first driver output, said first high voltage level when said driver circuitry discharges said second driver output to a voltage down below a turn-on threshold of said first driver high enable input, and wherein said second driver ceases to output, from said second driver output, a voltage higher than said low voltage, in response to said voltage of said first driver output exceeding a cut-off threshold of said second driver high enable input.

6. An integrated circuit comprising a level shifter, said level shifter comprising:

first and second drivers, each comprising a low enable input, a high enable input and an output which outputs a low voltage level signal when an enabling voltage level is received at said low enable input and a disabling voltage is received at said high enable input, and which outputs a first high voltage level signal, that is higher than a second high voltage level of an input signal, when a disabling voltage level is received at said low enable input and an enabling high voltage level is received at said high enable input, said high enable input of said first driver being connected to said output of said second driver, said high enable input of said second driver being connected to said output of said first driver, said low enable input of said first driver receiving a complement of said low enable input signal and said input of said second driver receiving said input signal, and transition driver circuitry, having an input receiving said second high voltage level, a first biasing input receiving said input signal and a second biasing input receiving said complement of said input signal, said transition driver circuitry responding to an input signal voltage level transition by charging said output of a first one of said first and second drivers to approximately said second high voltage level, and selectively discharging, to said low voltage level, said output of a second one of said first and second drivers so as to output a disabling voltage level to said high enable input of said first one of said first and second drivers and to output an enable voltage level to said high enable input of said second one of said first and second drivers.

* * * * *